(12) United States Patent
Bartley et al.

(10) Patent No.: US 9,111,899 B2
(45) Date of Patent: Aug. 18, 2015

(54) HORIZONTALLY AND VERTICALLY ALIGNED GRAPHITE NANOFIBERS THERMAL INTERFACE MATERIAL FOR USE IN CHIP STACKS

(75) Inventors: Gerald K. Bartley, Rochester, MN (US); Charles L. Johnson, Rochester, MN (US); John E. Kelly, III, Poughquag, NY (US); Joseph Kuczynski, Rochester, MN (US); David R. Motschman, Rochester, MN (US); Arvind K. Sinha, Rochester, MN (US); Kevin A. Splittstoesser, Stewartville, MN (US); Timothy J. Tofil, Rochester, MN (US)

(73) Assignee: Lenovo, Singapore (SG)

( * ) Notice: Subject to any disclaimer, the term of this patent is extended or adjusted under 35 U.S.C. 154(b) by 14 days.

(21) Appl. No.: 13/613,564

(22) Filed: Sep. 13, 2012

(65) Prior Publication Data

US 2014/0070393 A1    Mar. 13, 2014

(51) Int. Cl.
*H01L 23/48* (2006.01)
*H01L 23/10* (2006.01)
(Continued)

(52) U.S. Cl.
CPC ........ *H01L 23/367* (2013.01); *H01L 21/02656* (2013.01); *H01L 23/3677* (2013.01); *H01L 23/373* (2013.01); *H01L 23/4275* (2013.01); *H01L 24/95* (2013.01); *H01L 25/0657* (2013.01); *H01L 2224/16145* (2013.01); *H01L 2224/73253* (2013.01);
(Continued)

(58) Field of Classification Search
CPC ........ H01L 23/367; H01L 21/02; H01L 23/00

USPC ................ 257/690, 706, 712, 720, 773–777, 257/E23.08, E23.051, E23.011, E23.01; 977/700, 712, 742, 783–785
See application file for complete search history.

(56) References Cited

U.S. PATENT DOCUMENTS

| 6,407,922 B1 | 6/2002 | Eckblad et al. |
| 6,537,515 B1 | 3/2003 | Baker et al. |

(Continued)

FOREIGN PATENT DOCUMENTS

| JP | 2010034254 A * | 2/2010 |
| JP | 2010050259 A2 | 3/2010 |

(Continued)

OTHER PUBLICATIONS

Rodriguez, Nelly M. et al., "Catalytic Engineering of Carbon Nanostructures", American Chemical Society, Langmuir 1995, 11, pp. 3862 to 3866.

(Continued)

*Primary Examiner* — Amar Movva
*Assistant Examiner* — Sheikh Maruf
(74) *Attorney, Agent, or Firm* — Kunzler Law Group

(57) ABSTRACT

The chip stack of semiconductor chips with enhanced cooling apparatus includes a first chip with circuitry on a first side and a second chip electrically and mechanically coupled to the first chip by a grid of connectors. The apparatus further includes a thermal interface material pad placed between the first chip and the second chip, wherein the thermal interface material pad includes nanofibers aligned parallel to mating surfaces of the first chip and the second chip and nanofibers aligned perpendicular to mating surfaces of the first chip and the second chip.

13 Claims, 8 Drawing Sheets

(51) Int. Cl.
| | |
|---|---|
| H01L 23/34 | (2006.01) |
| H01L 23/367 | (2006.01) |
| H01L 23/00 | (2006.01) |
| H01L 21/02 | (2006.01) |
| H01L 23/373 | (2006.01) |
| H01L 23/427 | (2006.01) |
| H01L 25/065 | (2006.01) |

(52) U.S. Cl.
CPC .......... *H01L 2224/83909* (2013.01); *H01L 2225/06513* (2013.01); *H01L 2225/06541* (2013.01); *H01L 2225/06565* (2013.01); *H01L 2225/06589* (2013.01)

(56) References Cited

U.S. PATENT DOCUMENTS

| | | | |
|---|---|---|---|
| 6,721,796 | B1 | 4/2004 | Wong et al. |
| 6,730,731 | B2 | 5/2004 | Tobita et al. |
| 6,741,019 | B1* | 5/2004 | Filas et al. ............ 313/355 |
| 6,764,759 | B2 | 7/2004 | Duvall et al. |
| 6,790,425 | B1 | 9/2004 | Smalley et al. |
| 6,891,724 | B2 | 5/2005 | De Lorenzo et al. |
| 6,953,562 | B2* | 10/2005 | Baker et al. ............ 423/447.3 |
| 6,965,513 | B2 | 11/2005 | Montgomery et al. |
| 7,189,778 | B2 | 3/2007 | Tobita et al. |
| 7,238,415 | B2 | 7/2007 | Rodriguez et al. |
| 7,270,795 | B2 | 9/2007 | Kawakami et al. |
| 7,387,747 | B2 | 6/2008 | Taya et al. |
| 7,550,129 | B2 | 6/2009 | Baker et al. |
| 7,592,389 | B2 | 9/2009 | Baker et al. |
| 7,649,308 | B2 | 1/2010 | Lee et al. |
| 7,674,410 | B2 | 3/2010 | Huang et al. |
| 7,784,531 | B1 | 8/2010 | Li et al. |
| 7,803,262 | B2 | 9/2010 | Haik et al. |
| 7,847,394 | B2 | 12/2010 | Dubin et al. |
| 8,039,953 | B2 | 10/2011 | Dangelo |
| 8,048,794 | B2 | 11/2011 | Knickerbocker |
| 8,106,510 | B2 | 1/2012 | Altman et al. |
| 2005/0061496 | A1* | 3/2005 | Matabayas ............ 165/185 |
| 2005/0135988 | A1* | 6/2005 | Baker et al. ............ 423/448 |
| 2005/0239948 | A1* | 10/2005 | Haik et al. ............ 524/496 |
| 2005/0269726 | A1 | 12/2005 | Matabayas |
| 2006/0019079 | A1* | 1/2006 | Rodriguez et al. ....... 428/292.1 |
| 2008/0042261 | A1* | 2/2008 | Wolter et al. ............ 257/706 |
| 2009/0068387 | A1 | 3/2009 | Panzer et al. |
| 2009/0166021 | A1 | 7/2009 | Slaton et al. |
| 2009/0236037 | A1 | 9/2009 | Fisher et al. |
| 2009/0269604 | A1* | 10/2009 | Wang et al. ............ 428/545 |
| 2010/0224352 | A1 | 9/2010 | Stuckey et al. |
| 2013/0020716 | A1* | 1/2013 | Kuczynski et al. ......... 257/774 |
| 2013/0127069 | A1* | 5/2013 | Boday et al. ............ 257/777 |

FOREIGN PATENT DOCUMENTS

| | | |
|---|---|---|
| WO | 2004090944 A2 | 10/2004 |
| WO | 2005031864 A1 | 4/2005 |
| WO | 2006044938 A2 | 4/2006 |
| WO | 2007089257 A2 | 8/2007 |

OTHER PUBLICATIONS

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in $CO\_CO_2\_H_2$ Mixtures, I. Influence of Carrier Gas Composition," Carbon, vol. 30, No. 6, pp. 859-863, 1992.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200, filed Jul. 23, 2010, "Method and System for Alignment of Graphite Nanofibers for Enhanced Thermal Interface Material Performance".

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics," J. Heat Transfer, vol. 130, Issue 4. Apr. 2008. 8 pp.

Xie et al., "Dispersion and alignment of carbon nanotubes in polymer matrix: A review," Materials Science and Engineering: R: Reports, vol. 49, Issue 4, pp. 89-112, May 19, 2005.

Disclosed Anonymously, "Stretchable Thermal Interface Materials for Alignment of Graphitic Structures for Chipstack Cooling", IP.com Prior Art Database, IP.com No. IPCOM000213539D, Dec. 20, 2011.

\* cited by examiner

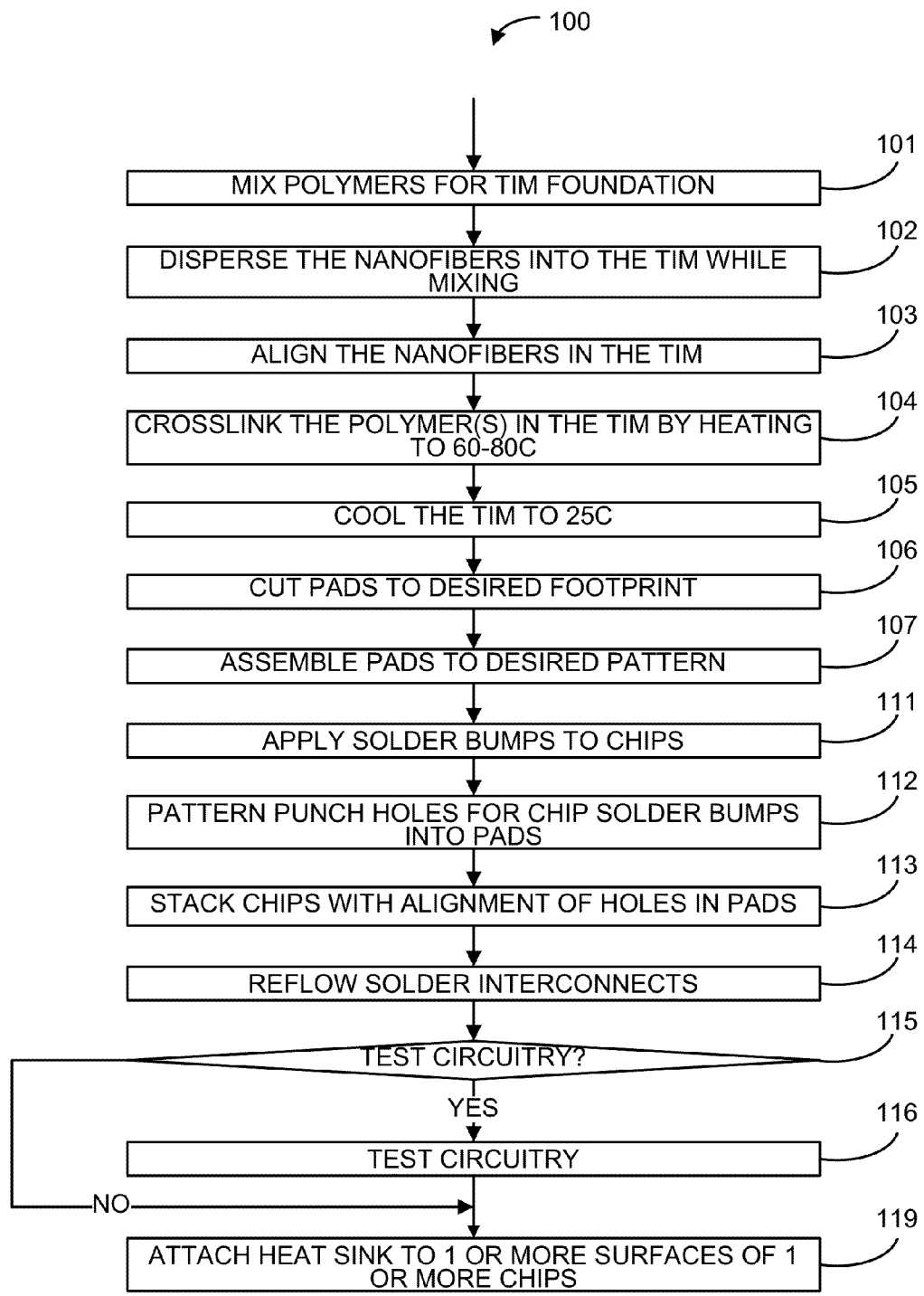

HORIZONTALLY AND VERTICALLY ALIGNED GRAPHITE NANOFIBERS THERMAL INTERFACE MATERIAL FOR USE IN CHIP STACKS

FIELD OF THE INVENTION

The present invention generally relates to thermal interface materials, and more particularly, to a method and system for aligning graphite nanofibers in a thermal interface material used in three dimensional chip stacks.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease or adhesive is commonly used. Thermal interfaces are typically formed by pressing the heat sink or chip cap onto the backside of the processor chip with a particle filled viscous medium between, which is forced to flow into cavities or non-uniformities between the surfaces.

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

It has been determined that stacking layers of electronic circuitry (i.e. 3 dimensional chip stack) and vertically interconnecting the layers provides a significant increase in circuit density per unit area. However, one significant problem of the three dimensional chip stack is the thermal density of the stack. For a four layer 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface.

On the chip side (i.e. the heat source), there usually exists hotspots, areas of higher power density, where most of the processing takes place, which results in a temperature gradient across the chip. These areas of higher heat and power density need to be kept within a set temperature range in order for the chip to perform properly and to pass quality and specification tests at the end of manufacturing.

Accordingly, it would be desirable to provide for reduced thermal resistance between heat sources and a cooling device that is both efficacious and yet not require changes to the microprocessor fabrication process.

BRIEF SUMMARY

The exemplary embodiments of the present invention provide a method for enhancing internal layer-layer thermal interface performance and a device made from the method. In particular, to a method and system for aligning graphite nanofibers in a thermal interface material used in three-dimensional chip stacks.

An exemplary embodiment includes a method for enhancing the cooling of a chip stack of semiconductor chips. The method includes creating a first chip with circuitry on a first side, and creating a second chip electrically and mechanically coupled to the first chip by a grid of connectors. The method further includes placing a thermal interface material pad between the first chip and the second chip, wherein the thermal interface material pad includes nanofibers aligned parallel to mating surfaces of the first chip and the second chip and nanofibers aligned perpendicular to mating surfaces of the first chip and the second chip.

Another exemplary embodiment includes a method for creating an enhanced thermal interface material pad for cooling of a chip stack of semiconductor chips. The method includes melting a thermal interface material, and dispersing the nanofibers into the thermal interface material. The method further includes creating the enhanced thermal interface material pad, wherein the enhanced thermal interface material pad includes the nanofibers arranged such that two opposite sides of the thermal interface material pad conduct heat in one direction parallel with the sides of the thermal interface material pad and in a second direction perpendicular with the sides of the thermal interface material pad.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The apparatus further includes a thermal interface material pad placed between the first chip and the second chip, wherein the thermal interface material pad includes nanofibers aligned parallel to mating surfaces of the first chip and the second chip and nanofibers aligned perpendicular to mating surfaces of the first chip and the second chip.

Another exemplary embodiment includes a system for enhancing the cooling of a chip stack of semiconductor chips. Briefly described in terms of architecture, one embodiment of the system, among others, is implemented as follows. The system includes a first chip with circuitry on a first side, and a second chip electrically and mechanically coupled to the first chip by a grid of connectors. The system further includes a thermal interface material pad placed between the first chip and the second chip, wherein the thermal interface material pad includes a first set of nanofibers aligned parallel to mating surfaces of the first chip and the second chip and aligned perpendicular to a second set of nanofibers aligned parallel to mating surfaces of the first chip and the second chip and aligned perpendicular to the first set of nanofibers, and includes a third set of nanofibers aligned perpendicular to mating surfaces of the first chip and the second chip and aligned perpendicular to the first set of nanofibers and the second set of nanofibers. The system still further includes a first pair of heatsinks connected to the chip stack, wherein the first pair of heatsinks are connected to the thermal interface material pad on the conductive axis of the first set of nanofibers in the thermal interface material pad, and a second pair of heatsinks connected to the chip stack, wherein the second pair of heatsinks are connected to the thermal interface material pad on the conductive axis of the second set of nanofibers in the thermal interface material pad.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 6A is a flow chart illustrating an example of a method of forming a silicone device utilizing the thermal interface material with graphite nanofibers horizontally/vertically aligned by a magnetic field and heat to orient the conductive axis in the desired direction of the present invention.

Figure 1:
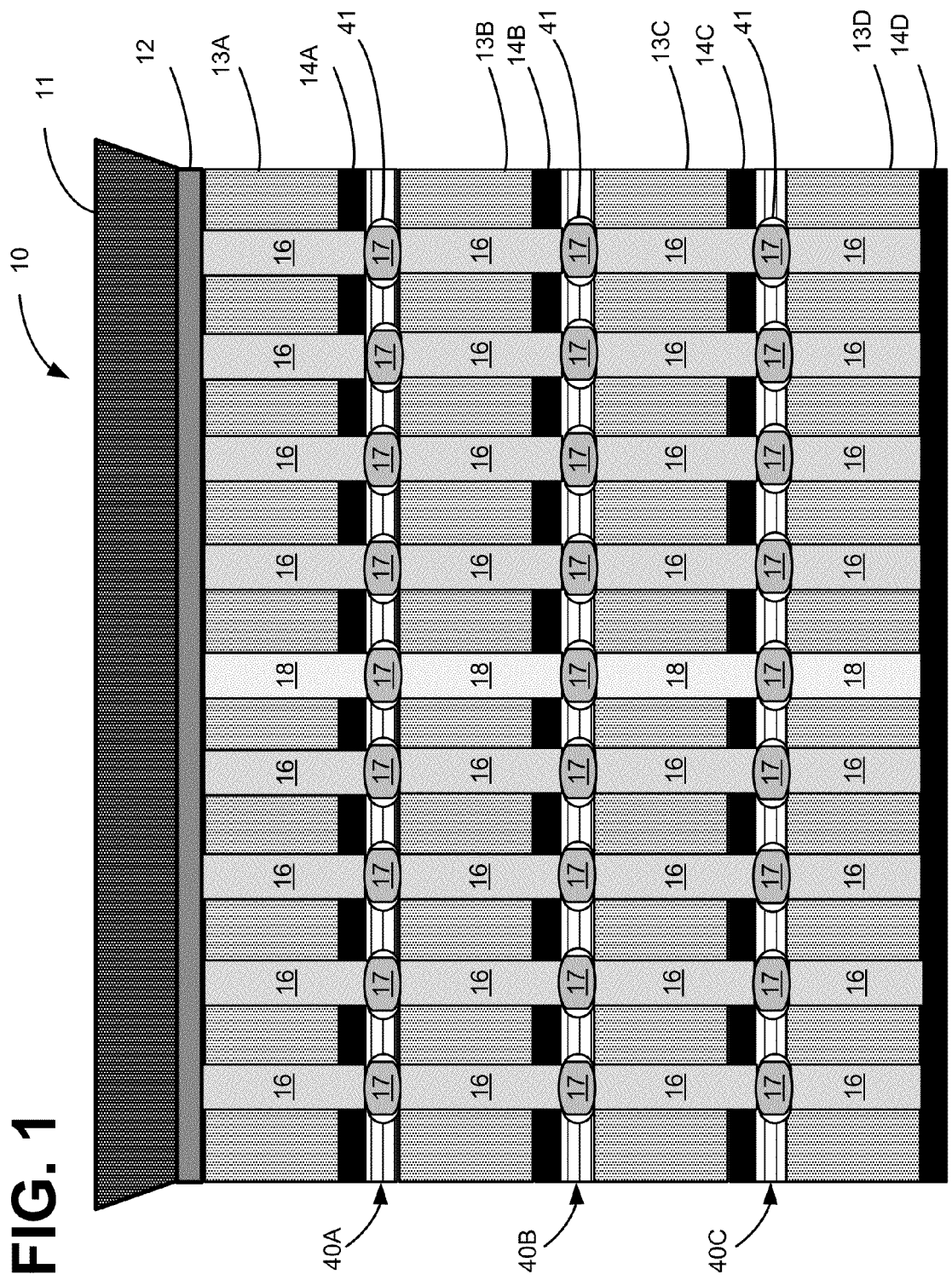
FIG. 1 is a cross section block diagram illustrating an example of the C4 or flip chip connection channels in a silicon device stack utilizing the thermal interface material with graphite nanofibers aligned by a magnetic field to orient the conductive axis in the desired direction of the present invention.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

One or more exemplary embodiments of the invention are directed to providing a material that is placed between chips in a chip stack. The materials having carbon nanofibers/nanotubes aligned to efficiently transfer heat to at least two sides (e.g., east and west, or north and south) of a chip stack. The materials having carbon nanofibers/nanotubes aligned transfers heat more efficiently along the axis of the carbon nanofibers/nanotubes. The carbon nanofibers are formed around magnetic "seeds". The material is heated and the carbon nanofibers/nanotubes are mixed into a liquified material. A magnetic field is applied in a direction parallel to sides of a pad that would be in contact with semiconductor chips or other like electronic devices. The field is strong enough to align the carbon nanofibers/nanotubes. The material is then cooled, sliced into pads and placed between layers of chips in the chip stack. In one embodiment, all carbon nanofibers/nanotubes are aligned "east/west" and draw the heat to heat sinks on the east and west sides of the chip stack. In another embodiment, the pads are alternated among chips so that alternating layers draw heat to heat sinks on the east/west sides of the chip stack and to the north/south side of the chip stack. In still another embodiment, pieces of the pads are arranged such that two opposite sides of the arrangement conduct heat east/west and another two opposite sides conduct heat north/south. In this embodiment, the carbon nanofibers/nanotubes are arranged so that both ends are perpendicular to the closest edge of the pad.

It is well established that the incorporation of certain types of materials with sufficient flow characteristics to "flow" and "fill" those gaps are not very thermally conductive. Materials with low-viscosity/high surface tension are required to fill the space between the layers of chips in a chip stack. Thermal properties of underfills and other adhesives are improved by mixing (or "filling") ceramic, metal, and/or other particulate or strands into the primary polymer, epoxy, or matrix.

A thermal interface material is used to fill the gaps between thermal transfer surfaces, such as between microprocessors and heatsinks, in order to increase thermal transfer efficiency. These gaps are normally filled with air which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials' latent heat storage can be achieved through solid-solid, solid-liquid, solid-gas and liquid-gas phase change. However, the only phase change used for thermal interface phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

It is well known that the incorporation of certain types of carbon nanofibers into thermal interface material can impart thermal conductivity to such materials. Carbon nanofibers or carbon nanotubes can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. Carbon nanofibers are graphitized fibers produced by catalytic synthesis around a catalytic core. The catalytic core around which graphite platelets are formed is, for exemplary purposes, called a metal seed or a catalytic metal seed, wherein the catalytic metal seed is a material having magnetic properties such as iron, cobalt, or nickel. Other non-metal materials suitable for forming magnetically alignable graphite nanofibers are within the scope of the invention.

Graphite nanofibers can be grown in numerous shapes around a catalytic metal seed. From the physical point of view, graphite nanofibers vary from 5 to 100 microns in length and are between 5 to 100 nm in diameter. The graphite nanofibers comprised of graphite platelets are arranged in various orientations with respect to the long axis of the fiber, giving rise to assorted conformations. In one embodiment, a magnetic field is applied to the metal catalyst prior to deposition of the graphite nanofibers on the metal-core. With the application of a magnetic field, the magnetic poles of the seed are aligned with the magnetic field and will subsequently carry the attached graphite nanofibers along with them as they rotate in the applied field following deposition.

With a diamond shaped catalytic metal seed, the majority of the graphite platelets will align along the fiber axis as dictated by an external magnetic field, so that the catalytic metal seed may have its poles aligned perpendicular to or parallel to the external magnetic field. The seed particles are not limited to elongated diamonds, so that the deposited metal-core graphite nanofiber forms the chevrons. The graphite platelets can assume any of a myriad of shapes. If the catalytic metal seeds are rectangular plates, then the graphite platelets are deposited as plates. If the catalytic metal seeds are cylindrical, then the graphite platelets are deposited as cylindrical plates. If the catalytic metal seeds are little bars, then the graphite platelets are deposited as rectangular solids along the long axis of the rectangular bar. The graphite platelets assume the geometry of the catalytic metal seed surface.

Carbon nanotubes (CNTs) are allotropes of carbon with a cylindrical nanostructure. Nanotubes have been constructed with a length-to-diameter ratio of up to 132,000,000:1, significantly larger than any other material. They exhibit extraordinary strength and unique electrical properties, and are efficient thermal conductors.

Nanotubes are members of the fullerene structural family, which also includes the spherical buckyballs. The ends of a nanotube may be capped with a hemisphere of the buckyball structure. Their name is derived from their size, since the diameter of a nanotube is on the order of a few nanometers (approximately 1/50,000th of the width of a human hair), while they can be up to 18 centimeters in length.

Graphite nanofibers and nanotubes have received considerable attention in the electronics field due to their remarkable thermal conductivity. Moreover, the thermal conductivity of graphite nanofibers and nanotubes are anisotropic. Anisotropy is the property of being directionally dependent, as opposed to isotropy, which implies homogeneity in all directions. Therefore, the present invention takes advantage of the anisotropic nature of the graphite nanofibers and nanotubes by effectively aligning them along the conductive axis, thereby generating a thermal interface material with exceptional thermal conductivity at comparatively low loading levels. Diamond, graphite, and graphite fibers have been known as excellent heat conductors with a high thermal conductivity up to 3000 W/m·K.

All nanotubes are expected to be very good thermal conductors along the tube, exhibiting a property known as "ballistic conduction", but good insulators laterally to the tube axis. Measurements show that a single wall nanotube has a room-temperature thermal conductivity along its axis of about 3500 W/m·K compared to copper, a metal well-known for its good thermal conductivity, which transmits 385 W/m·K. A single wall nanotube has a room-temperature thermal conductivity across its axis (in the radial direction) of about 1.52 W/m·K, which is about as thermally conductive as soil. Diamond, graphite, and graphite fibers have been known as excellent heat conductors with a high thermal conductivity up to 3000 W/m-K. Table 1 lists the maximum power per chip which can be cooled effectively, assuming 100% coverage, with the incorporation of certain types of materials into thermal interface materials and the thermal conductivity of such materials.

TABLE 1

| TIM Materials | Conductivity (W/mK) | Power (W) per chip |
|---|---|---|
| Grease | 2.8 | 35 |
| Gel | 5.7 | 80 |
| CNF | 6000 | >300 |
| CNT | 3500 | ~150 |

Referring now to the drawings, in which like numerals illustrate like elements throughout the several views. FIG. 1 is a cross section block diagram illustrating an example of a controlled collapse chip connection 17 (i.e. C4) or flip chip, electrically conductive channels 16 and thermal conductive channels 18 utilized in a chip stack 10.

The chip stack 10 comprises a multitude of chips 13 (A-D) that further include one or more electrically conductive channels 16 and/or thermal conductive channels 18, which extend through a chip 13 from the top surface to the bottom surface. In one embodiment, the "conductive channel" is really a combination of two or more thru-silicon-vias (TSVs) connected sequentially by one or more controlled collapse chip connection 17 (C4s).

Preferably, the electrically conductive channels 16 are formed of tungsten or copper; however, other conductive materials may be used and are contemplated. The electrically conductive channels 16 selectively conduct electrical signals to and from portions of the circuitry 14 thereon or simply couple to solder bumps 17 to interconnect differing chips 13 in the chip stack 10 (e.g., chips 13A and 13B), or both. The solder bumps 17 are located within an area 41 of a thermal interface material (TIM) pad 40. In one embodiment, the area 41 is punched out of the TIM pad 40. In another embodiment, the area 41 is formed during the creation of the TIM pad 40.

The TIM pad 40 comprises carbon nanotubes (CNTs) or graphite nanofibers (GNFs) that are dispersed in a phase change material (PCM) or a silicone grease. The CNTs or GNFs are then aligned in the xy plane (i.e. positioned parallel to the surface of the chip 13). This is so that heat may be brought to the edges of the chip stack 10. Once the heat is brought to the edges of the chip stack 10, multiple heat sinks or other type devices may be utilized to more efficiently dissipate the heat of the chip stack 10.

The CNTs or GNFs are aligned in the thermal interface material 30 in one direction by an applied magnetic field. By aligning the CNTs or GNFs along the conductive axis in the xy plane of the 3D chip stack 10 creates a TIM pad 40 with exceptional thermal conductivity at comparatively low loading levels. The system and method for aligning graphite nanofibers to enhance thermal interface material performance are described in commonly assigned and co-pending U.S. patent application Ser. No. entitled "A METHOD AND SYSTEM FOR ALIGNMENT OF GRAPHITE NANOFIBERS FOR ENHANCED THERMAL INTERFACE MATERIAL PERFORMANCE", Ser. No. 12/842,200 filed on, Jul. 23, 2010, herein incorporated by reference.

Preferably, the thermal conductive channels 18 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channels 18 use micronized or pulverized silver. Another type of thermal conductive channels 18 are the phase-change materials. The phase change materials are solid at room temperature, but liquefy and behave like grease at operating temperatures. The thermal conductive channels 18 conduct heat to and from portions of the circuitry 14 thereon. The thermal conductive channels 18 couple to solder bumps 17 to interconnect differing chips 13 in the chip stack 10 (e.g., chips 13A and 13B), couple to heat sink 11 through thermal grease 12 or TIM pad 40 of the present invention, that conducts the heat to the side of the chip stack 10.

The conductive channels 16 couple to solder bumps 17 on a bond pad (not shown) on the bottom surface of chip 13A-C. The solder bumps 17 are electrically isolated from the chip 13 and one another according to conventional practice. In addition, the conductive channels 16 are preferably electrically insulated from the chip 13 by insulating regions (not shown) which are disposed between the conductive channels 16 and the chip 13. The insulating regions preferably are silicon dioxide ($SiO_2$); however, other insulating materials may be employed and are contemplated as falling within the scope of the present invention. The insulating regions prevent the signals being transmitted in the electrically conductive channels 16 from disturbing the bias voltage of the chip 13 (which is typically either a ground potential or a Vdd). Of course, in some cases, one of the terminals of the circuitry 14 on the top surface may be held at a substrate potential, in which case, the appropriate electrically conductive channel 16 may be non-insulated and thus be in electrical contact with the chip 13 being held at a similar potential, as may be desired.

As shown, each chip 13 uses conductive channels 16 in a controlled, collapse chip connection (C4) structure (also often called solder bump or flip-chip bonding). The chip stack 10 includes a base chip 13A. Solder bumps 17 are then placed on a bond pad (not shown) for the conductive channel 16 of a second (or top) chip 13A, which is oriented face-down (i.e., flip-chip), aligned and brought into contact with the conductive channels 16. Electrical interconnections between the electrically conductive channels 16 are formed by heating the solder bumps 17 to a reflow temperature, at which point the solder flows. After the solder flows, subsequent cooling results in a fixed, electrically conductive joint to be formed between the electrically conductive channels 16.

The base chip 13A on one side is attached to a heat sink 11 with thermal grease 12. In an alternative embodiment, a thermal interface material incorporating vertically aligned carbon (graphite) nanofibers can be utilized in place of thermal grease 12 as a very effective thermal interface material between a top of base chip 13A and a heat sink 11. Such an arrangement is disclosed in U.S. patent application (entitled "A METHOD AND SYSTEM FOR ALIGNMENT OF GRAPHITE NANOFIBERS FOR ENHANCED THERMAL INTERFACE MATERIAL PERFORMANCE", Ser. No. 12/842,200. Other chips 13B-13D can have C4 connection structures implemented on both the top surface and bottom surface thereof, as illustrated in FIG. 1. In such instances, a second chip 13B may similarly be oriented facedown with respect to the base chip 13A and coupled thereto-using solder bumps 17.

The C4 structure of FIG. 1 overcomes one disadvantage of the connection methodologies. Initially, because the ball-bonding attachment technique is avoided, significantly less stress is placed on the solder bump 17 during connection, which allows circuitry 14A-C to be formed under the solder bump 17. The circuitry 14A-C is formed according to any one of many conventional semiconductor processing techniques. However, the C4 structure of FIG. 1 has one major disadvantage of not being able to dissipate the heat generated by circuitry 14 A-D. The TIM pad 40 of the present invention, comprises carbon nanotubes (CNTs) or graphite nanofibers (GNFs) that are dispersed in a phase change material (PCM) or a silicone grease. The CNTs or GNFs are aligned in the position parallel to the surface of the chip 13. This is so that heat may be brought to the edges of the chip stack 10. Once the heat is brought to the edges of the chip stack 10, multiple heat sinks or other type devices may be utilized to more efficiently dissipate that heat of the chip stack 10. In one embodiment, all carbon nanofibers/nanotubes are aligned "east/west" and draw the heat to heat sinks on the east and west sides of the chip stack.

Figure 2A:
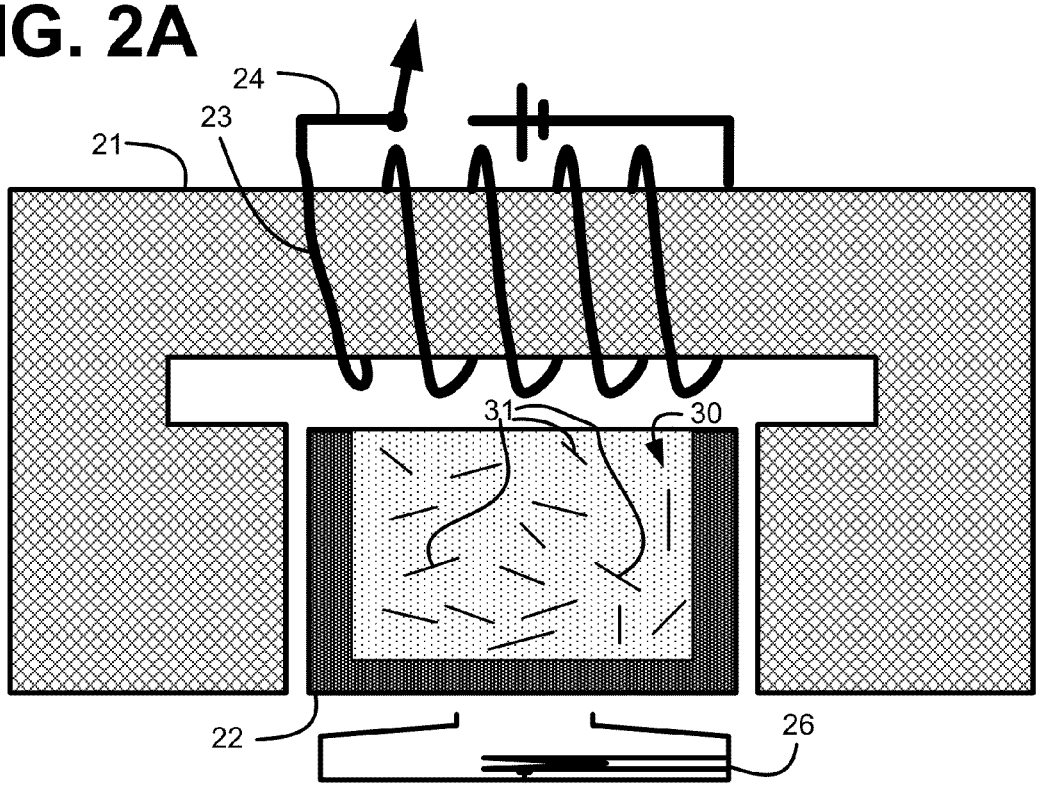
FIG. 2A is a block diagram illustrating an example of the graphite nanofibers randomly dispersed in the thermal interface material.

FIG. 2A is a block diagram illustrating an example of the graphite nanofibers 31 randomly dispersed in the thermal interface material 30. As shown, there is thermal interface material 30 in a crucible 22. The crucible 22 is heated to a temperature by heater 26 so that the thermal interface material 30 melts. In one embodiment, the thermal interface material 30 is melted at a temperature 10-20 C above the thermal interface material 30 melting temperature. In one embodiment, the thermal interface material 30 is a paraffin based material and is surrounded on two sides by electromagnet 21. The magnetic fields are generated in the electromagnet 21 by coils 23 around the electromagnet 21. The coils 23 are connected to switch 24, which allows power to be applied.

Figure 2B:
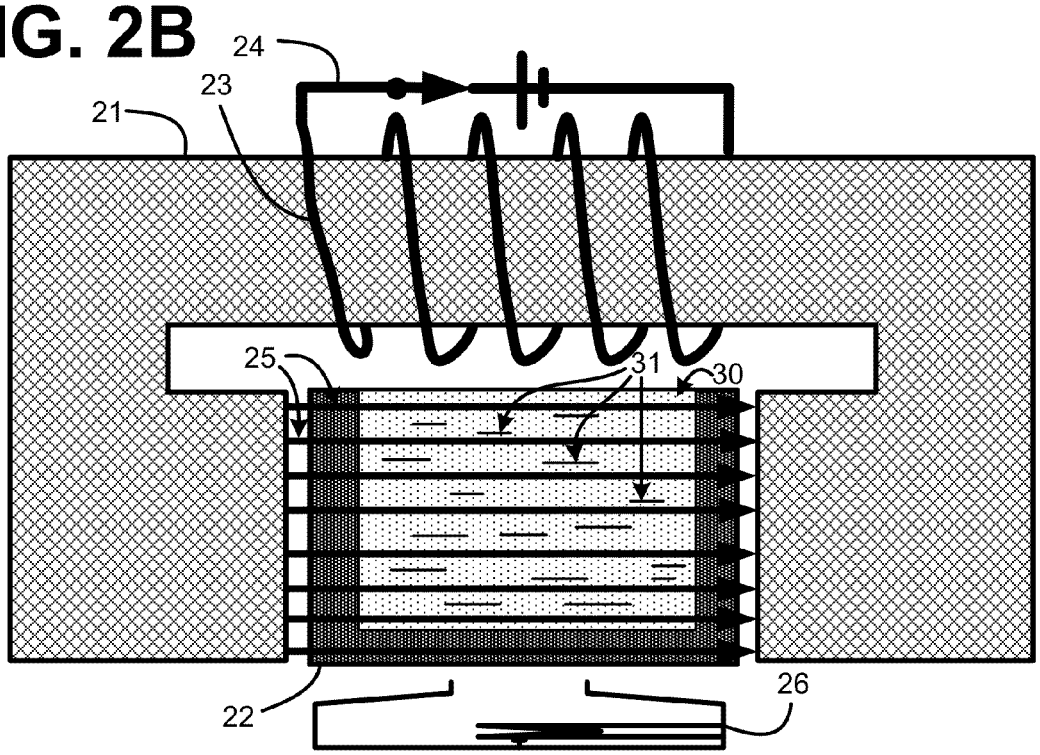
FIG. 2B is a block diagram illustrating an example of the thermal interface material with graphite nanofibers aligned by a magnetic field to orient the conductive axis in the desired direction in the thermal interface material.

FIG. 2B is a block diagram illustrating an example of the thermal interface material 30 with graphite nanofibers 31 aligned by a magnetic field 25 to orient the conductive axis in the desired direction in the thermal interface material 30. A magnetic field 25 of sufficient intensity is applied to the thermal interface material 30 containing the graphite nanofibers 31, in order to align the graphite nanofibers 31. In one embodiment, the long axis of the graphite nanofibers 31 is aligned in an orientation parallel to the mating surfaces. In another embodiment, the graphite nanofibers 31 are aligned along the conductive axis of the graphite fibers. The crucible 22 is cooled to approximately room temperature. Once the crucible 22 with the aligned graphite nanofibers 31 in the phase change material has cooled to approximately room temperature, the thermal interface material 30 is removed from the crucible 22. In one embodiment, room temperature is normally within the range of 60 to 80° F. The thermal interface material 30 can be, but is not limited to, paraffins $(C_nH_{2n+2})$; fatty acids $(CH_3(CH_2)_nCOOH)$; metal salt hydrates $(M_nH_2O)$; and eutectics (which tend to be solutions of salts in water). In still another embodiment, the thermal interface material 30 can be silicone-based gels or pastes that are eventually cured into pads.

The graphite nanofibers 31 are dispersed into the melted thermal interface material 30 using well-established methods. In one embodiment, a high-speed dispersive mixer can be utilized. The amount of graphite nanofibers 31 in the thermal interface material 30 of the present invention will typically be in the range of 4 to 10 weight percent based on the amount of base phase change material, preferably ~5 weight percent. The graphite nanofibers 31 typically are dispersed essentially homogeneously throughout the bulk of the thermal interface material 30. The crucible 22 is cooled to approximately room temperature. The TIM pads 40 are then cut to the desired footprint from the thermal interface material 30. Pads of appropriately sized geometry (length X and width Y) are cut from the slab of thermal interface material 30 using conventional techniques known to those skilled in the art. The footprint of the integrated circuit to which the thermal interface material pad 40 will be mated, dictates the geometry.

According to the present disclosure, the thermal conductivity at desired locations is increased by TIM pad 40 with aligned graphite nanofibers 31 between the multiple chips 13A-D. By utilizing the TIM pad 40 with aligned graphite nanofibers 31 between multiple chips 13A-D, more heat transfer to the edge of the chip stack 10 can be achieved. The advantage of this solution is that it further reduces chip temperatures through no modification to the chip surface and does not require changes to the manufacturing line or the addition of more components to the system such as liquid coolants and microchannel heat exchangers.

Figure 2C:
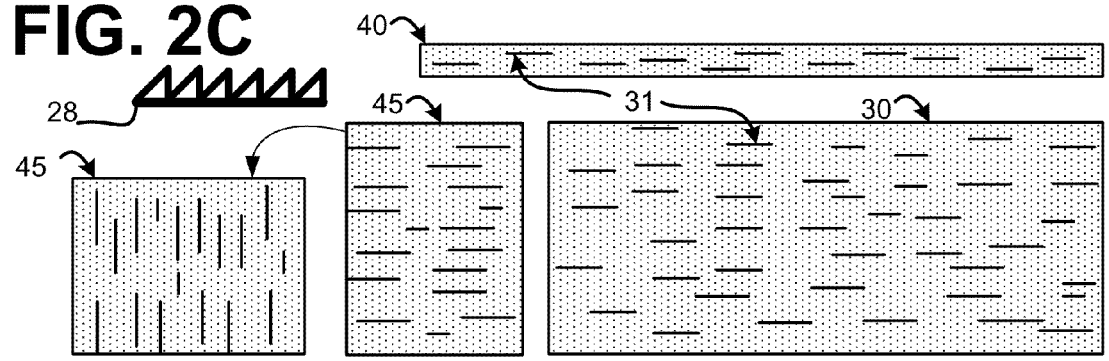
FIG. 2C is a block diagram illustrating an example of the slicing the thermal interface material into the desired footprint.

FIG. 2C is a block diagram illustrating an example of the slicing the thermal interface material 30 into the desired footprint or TIM pad 40 and block 45. Pads 40 of appropriately sized geometry (length X and width Y) are cut from the slab of thermal interface material 30 using conventional techniques of dicing apparatus 28 known to those skilled in the art. The geometry of pad 40 is dictated by the footprint of the integrated circuit to which the thermal interface material pad 40 will be mated. Blocks 45 of appropriately sized geometry (length X and width Y) are cut from the slab of thermal interface material 30 using conventional techniques of dicing apparatus 28 known to those skilled in the art. The block 45 is rotated so that the graphite nanofibers 31 are vertically aligned. The footprint of the vertical shaft to which the thermal interface material pads 40 will be constructed around the geometry of block 45.

Figure 3A:
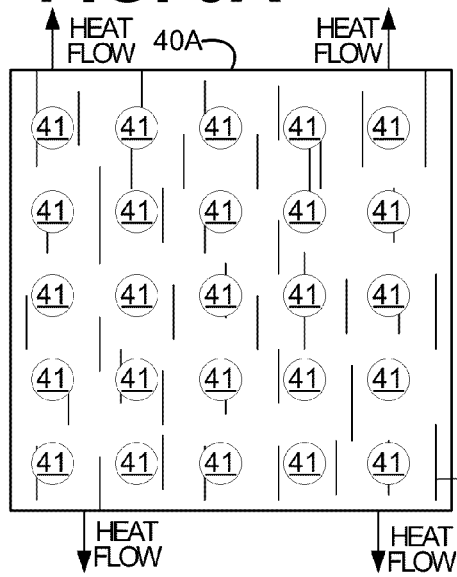
FIGS. 3A and 3B are block diagrams illustrating an example of a top view of the thermal interface material with graphite nanofibers aligned by a magnetic field to orient the conductive axis in perpendicular directions to the thermal interface material, and having a plurality of punch holes formed at various locations thereon.
Figure 3B:
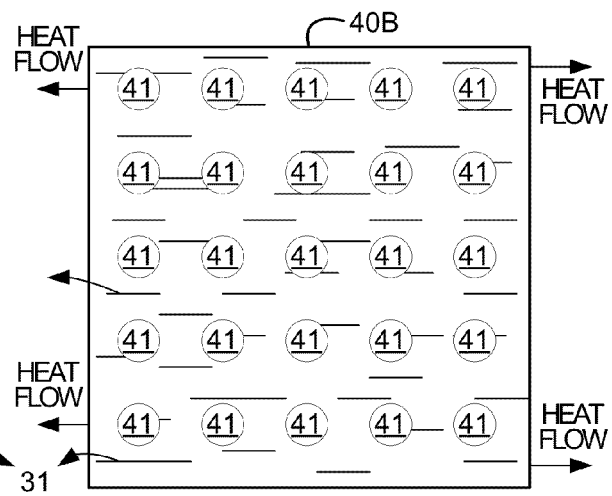

FIGS. 3A and 3B are block diagrams illustrating an example of a top view of the TIM pad 40 with graphite nanofibers 31 aligned by a magnetic field 25 to orient the conductive axis in perpendicular directions to the TIM pad 40, and having a plurality of areas 41 formed at various locations thereon. Areas 41 provide space for the solder bumps 17 that are formed on conductive channels 16, on the chip 13. The solder bumps 17 rest on conductive channels 16 to connect one chip to another chip through TIM pad 40 to electrically conductive signals from, say for example, chip 13A to another chip 13B. In another embodiment, the solder bumps 17 can conduct heat from, say for example, chip 13A to another chip 13B and eventually heat sink 11. In another embodiment, the solder bumps 17 can conduct heat laterally from the solder bumps 17 through TIM pad 40(A-C) between two chips 13(A-D) to the edges of the chip stack 10. In another embodiment, the direction of the graphite nanofibers 31 in TIM pads 40 are alternated among chips so that alternating layers draw heat to heat sinks on the east/west sides of the chip stack and to the north/south side of the chip stack.

As shown, the plurality of solder bumps 17 and areas 41 are circular, however, this is for illustration only and the solder bumps 17 and areas 41 may be of any shape including, but not limited to, triangular, rectangular, square, circular, elliptical, irregular or any four or more sided shape. The size and shape of areas 41 are generally determined by the size and shape of solder bump 17. This is in order to provide a space in the TIM pad 40 for the solder bumps 17.

Also as shown, the solder bumps 17 and areas 41 in one embodiment are laid out in regular patterns, however, this is for illustration only and the solder bumps 17 and areas 41 have the flexibility to be laid out in any desired pattern. This additional level of flexibility allows the circuitry 14A-C to be laid out without regard to the solder bumps 17 and areas 41 locations. This further allows the solder bump 17 locations above the circuitry 14A-C to be located in an optimized fashion, to directly couple with circuitry on another chip 13. In another embodiment, the solder bumps 17 and areas 41 may be formed in a pattern where the conductive channels 16 provide power at the periphery of the chip 13 to aid in cooling the chip 13. Therefore, the solder bumps 17 and areas 41 may be located anywhere on the chip 13A-D as illustrated in FIG. 1, without the need to form such interconnections on peripheral edges of the die.

A TIM pad 40 is used to remove any gaps between thermal transfer surfaces, such as between chips 13 (A-D), microprocessors and heat sinks, in order to increase thermal transfer efficiency. Any gaps are normally filled with air, which is a very poor conductor.

Figure 3C:
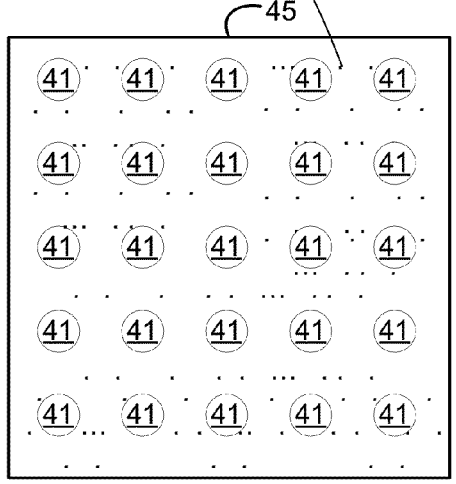
FIG. 3C is a block diagram illustrating an example of a top view of the thermal interface material with graphite nanofibers aligned by a magnetic field to orient the conductive axis in perpendicular directions to the thermal interface material, and having a plurality of punch holes formed at various locations thereon.

FIG. 3C is a block diagram illustrating a top view example of the thermal interface material block 45 with graphite nanofibers 31 oriented with the conductive axis in parallel with the solder bumps 17 and areas 41 on the TIM block 45. There are a plurality of areas 41 formed at various locations thereon. These areas 41 are for the solder bumps 17 to connect chips 13(A-D) together. In an alternative embodiment, additional TIM block 45 is in thermal contact with the center of TIM blocks 45 between chips 13(A-D) to effectively draw heat to a chip above and below to ultimately connect to heatsink 11 on a top of the chip stack 10. In another alternative embodiment, the additional TIM blocks 45 are in thermal contact with edges of TIM pads 40 hanging out between chips 13(A-D) to effectively draw heat to a heatsink 11 on the sides of the chip stack 10.

Figure 3D:
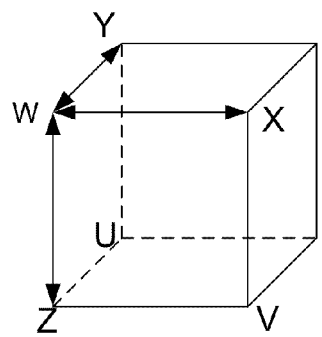
FIG. 3D is a block diagram illustrating an example of the vectors in which the graphite nanofibers are aligned.

FIG. 3D is a block diagram illustrating an example of the vectors in which the graphite nanofibers 31 are aligned. In this illustration, the nanofibers 31 horizontally (i.e. XWY plane) and vertically (i.e. XWZ plane) aligned through the chip stack using graphite nanofibers 31, as shown in FIGS. 3A-3C. The vertical nanofibers 31 (i.e. XWZ plane) are in a plane perpendicular to the horizontal nanofibers 31 (i.e. XWY plane). In order to differentiate the nanofibers 31 oriented in the horizontal plane (i.e. XWY plane) from the nanofibers 31 oriented in the vertical plane 31 (i.e. XWZ plane), from now on those fibers oriented in the vertical plane (i.e. XWZ plane) will be referred to as nanofibers 32. This means that the graphite nanofibers 31 are always aligned in the horizontal plane (i.e. XWY plane) perpendicular to the closest side edge (i.e. not top or bottom) of TIM pad 50. Whereas, graphite nanofibers 32 on pad 55 are aligned in the verical plane (i.e. XWZ plane) and always perpendicular to all graphite nanofibers 31.

Figure 4:
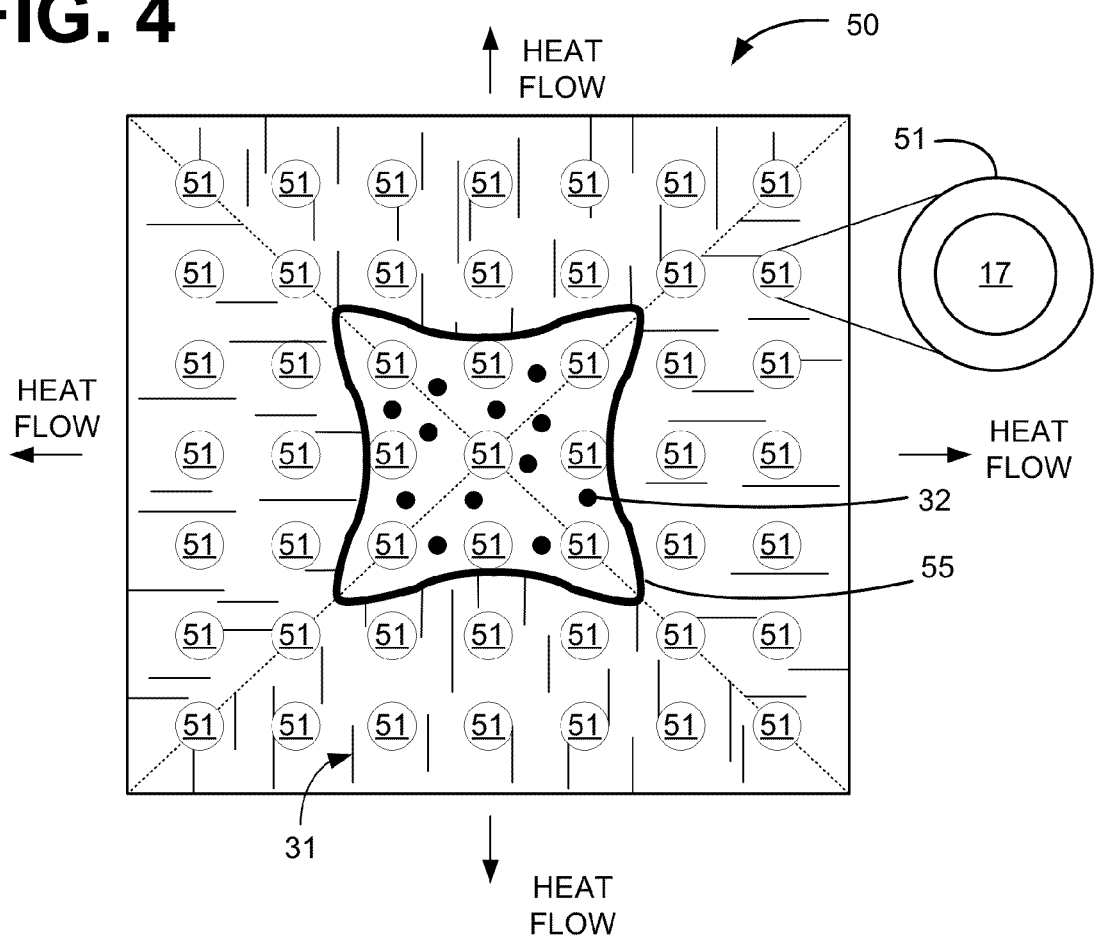
FIG. 4 is a block diagram illustrating an example of the thermal interface material with graphite nanofibers arranged such that two opposite sides of the thermal interface material with graphite nanofibers conduct heat in the east/west direction and another two opposite sides conduct heat in the north/south direction.

FIG. 4 is a block diagram illustrating a top down view example of the TIM pad 50 with graphite nanofibers 31 arranged such that two opposite sides of the thermal interface material 30 with graphite nanofibers 31 conduct heat in one direction parallel with the sides of the TIM pad 50 in contact with chip 13 and another two on opposite sides conduct heat in a second direction perpendicular to the first direction and still parallel with the sides of the TIM pad 50 in contact with chip 13. The illustrated example also shows the TIM pad 50 with a vertical heat transmission block 55 (i.e. channel) that includes graphite nanofibers 32 that are perpendicular to all graphite nanofibers 31 in the TIM pad 50. In this embodiment, the bi-directional TIM pad 50 displayed in the top down view illustrated in FIGS. 3A and 3B can be easily sectioned and connected together to conduct heat to all four sides of the chip stack using graphite nanofibers 31, and vertically through the vertical heat transmission block 55 using graphite nanofibers 32, as shown. The vertical heat transmission block 55 is cut from block 45 illustrated in FIG. 3C. This means that the graphite nanofibers 31 are always aligned in the horizontal plane (i.e. W→X AND W→Y plane) perpendicular to the closest edge of TIM pad 50. Whereas the graphite nanofibers 32 on vertical heat transmission block 55 are aligned in the vertical plane (i.e. XYZ→Z1 AND XYZ→X1 plane) and always perpendicular to all graphite nanofibers 31. In this embodiment, the pattern areas 51 for the chip solder bumps 17 on TIM pad 50 are generally applied after assembling the TIM pad 50. This is to ensure that the area 51 for the chip solder bumps 17 on chips 13 are properly aligned.

Figure 5:
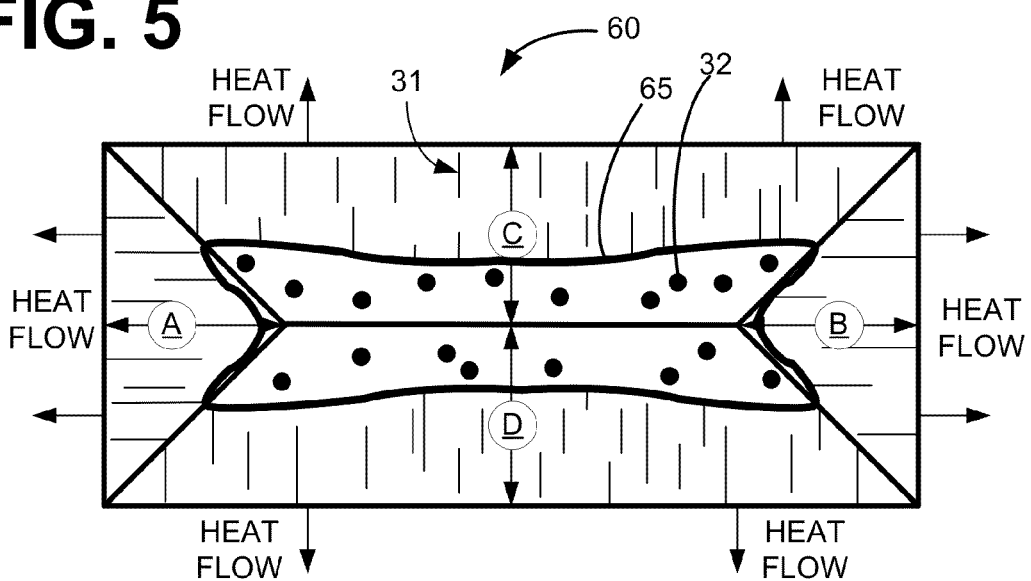
FIG. 5 is a block diagram illustrating another example of the thermal interface material with graphite nanofibers arranged such that two opposite sides of the thermal interface material with graphite nanofibers conduct heat in the east/west direction and another two opposite sides conduct heat in the north/south direction.

FIG. 5 is a block diagram illustrating another example of the TIM pad 60 with graphite nanofibers 31 arranged such that two opposite sides of the TIM pad 60 with graphite nanofibers 31 conduct heat in one direction parallel with the sides of the TIM pad 60 in contact with chip 13 and another two on opposite sides conduct heat in a second direction perpendicular to the first direction and still parallel with the sides of the TIM pad 40 in contact with chip 13. The illustrated example also shows the TIM pad 60 with a vertical heat transmission block 65 (i.e. channel) that includes graphite nanofibers 32 that are perpendicular to all graphite nanofibers 31 in the TIM pad 60. In this embodiment, the bi-directional TIM pad 60 displayed in the top down view illustrated in FIGS. 3A and 3B can be easily sectioned and connected together to conduct heat to all four sides of the chip stack using graphite nanofibers 31 and vertically through the vertical heat transmission block 65 illustrated in FIG. 3C using graphite nanofibers 32, as shown. This means that the graphite nanofibers 31 are always aligned in the XY plain perpendicular to the closest edge of TIM pad 60. Whereas the graphite nanofibers 32 on pad 65 are aligned in the ZX or ZY plane and always perpendicular to all graphite nanofibers 31. In this alternative embodiment, the bi-directional TIM pad 60 displayed in a top down view illustrated in FIGS. 3A and 3B can be easily sectioned and connected together to conduct heat to all 4 sides of the chip stack as shown, so that the graphite nanofibers 31 conduct heat to the closest edge of the TIM pad 60. In this alternative embodiment, the TIM pad 60 is in a rectangular shape where the area of region A=B=C=D no matter what the W/L ratio of the rectangle. In this alternative embodiment, a chip stack 10 of memory chips is covered. The pattern areas for the chip solder bumps 17 on TIM pad 60 are generally applied after assembling the TIM pad 60. This is to ensure that the area 51 for the chip solder bumps 17 on chips 13 are properly aligned.

FIG. 6A is a flow chart illustrating an example of a method of forming a chip stack 10 utilizing the TIM pad 40 with graphite nanofibers 31 horizontally/vertically aligned by a magnetic field 25 and heated to orient the conductive axis in the desired direction of the present invention. There are a couple approaches to forming the individual chips 13, and subsequent assembly, so the following is just one example of a method of constructing silicon devices in a multilayer stack 10 utilizing the thermal interface material pad 40 with aligned graphite nanofibers 31.

At step 101, at least one thermosetting polymer is added to create the TIM 30 foundation. In one embodiment, the thermal interface material 30 is prepared according to the following procedure. To at least a 25 ml round bottom flask, aminopropylmethyl-dimethylsiloxane copolymer (5 g, 0.002 moles APTES) (commercially available from Gelest Inc.) is added along with 15 ml of anhydrous tetrahydrofuran (THF) and a stir bar. To this solution, furfuryl isocyanate (0.262 g, 0.002 moles) is added drop wise. The reaction is stirred for 24 hrs at 50 C. THF is removed via distillation to yield the desired furfuryl polydimethylsiloxane (PDMS).

In an alternative embodiment, polymer 2 was prepared according to the following procedure. To at least a 100 ml round bottom flask, a furan-protected maleic anhydride or the furan-protected anhydride (0.5 g, 0.002 moles) is dissolved in 30 ml of benzene followed by the addition of a magnetic stir bar. To this solution, aminopropylmethyl-dimethylsiloxane copolymer (5 g, 0.002 moles APTES) (commercially available from Gelest Inc.) is added drop wise along with benzene (20 ml). This reaction is magnetically mixed for 2 hrs at 80 C. Then $ZnCl_2$ (0.27 g, 0.002 moles) is added and magnetically stirred for 30 min. Then a solution of hexamethyldisilazane (HMDS) (0.48 g, 0.003 moles) and benzene (2.0 ml) is added drop wise and the reaction was brought to reflux and mixed for 1 h. The solution is filtered and washed with 0.5 N HCl to work up the resultant product. The organic layer is dried with magnesium sulfate and the volatiles removed by distillation.

To prepare the TIM formulation, polymer 1 and polymer 2 are to be used at equal weight percents. While mixing polymer 1 and 2 together, the carbon fiber like structures can be added and mixed. Once mixed, the TIM can be applied and allowed to cure from room temperature to 70 C. When ready to align, the temperature is brought to approximately 110 C, at which point the polymer will under go a retro Diels-Alder reaction and un-crosslink the polymer, thus reducing the viscosity significantly and allowing for facile alignment via an external field. This will allow for optimal alignment of the carbon nanofibers 31 like structures. Below is an example to demonstrate the retro-Diels-Alder reaction.

At step 102, the graphite nanofibers 31 are dispersed into the TIM 30 using well-established methods. In one embodiment, a high-speed dispersive mixer can be utilized. The amount of graphite nanofibers 31 in the TIM 30 of the present invention will typically be in the range of 4 to 10 weight percent based on the amount of TIM 30, preferably ~5 weight percent. The graphite nanofibers 31 typically are dispersed essentially homogeneously throughout the bulk of the TIM 30. In an alternative embodiment, carbon nanofibers or nanotubes may be substituted for the graphite nanofibers 31.

At step 103, a magnetic field 25 (FIG. 2B) of sufficient intensity is applied to the TIM 30 containing the graphite nanofibers 31, in order to align the graphite nanofibers 31. In one embodiment, the long axis of the graphite nanofibers 31 is aligned along the conductive axis of the graphite fibers. In another embodiment, the graphite nanofibers 31 are aligned in an orientation perpendicular to the mating surfaces. In still another embodiment, the magnetic field is normally within the range of 500-160,000 Gauss or 0.05-16 Tesla.

At step 104, the TIM 30 with the carbon nanofibers 31 is heated to a temperature to crosslink the polymers in the TIM 30. In the preferred environment, the temperature of the TIM 30 is heated to and maintained at approximately 60° C.-80° C. At step 105, the TIM 30 is cooled to approximately room temperature, i.e. approximately 20° C.-25° C.

Once the TIM 30 with the aligned graphite nanofibers 31 has cooled to approximately room temperature, the TIM 30 is cut to the desired footprint for TIM pads 40 and blocks 45. TIM pads 40 and blocks 45 of appropriately sized geometry (length X, width Y and thickness Z) are cut from the slab of TIM 30 using conventional techniques known to those skilled in the art. The geometry of TIM pads 40 and blocks 45 are dictated by the footprint of the integrated circuit to which the TIM pads 40 and blocks 45 will be mated. At step 107, the TIM pads 40 and TIM block 45 are assembled into the desired pattern. In one embodiment, the pattern is the approximately square TIM pad 50. In another embodiment, the pattern is a rectangular TIM pad 60. In still another embodiment, the pattern is any geometry configuration designed for chip stacks 13.

At step 111, solder bumps 17 are then formed on the bottom surface of the chip 13. These solder bumps 17 are generally in alignment with the conductive channels 16 on chip 13 in order to conduct electrical signals. In an alternative embodiment, thermal conductive channels 18 may conduct heat instead of electrical signals and use a solder bump 17 with thermal conductive ability. In one embodiment, a homogenous process could be used to create solder bump 17 for both electrically conductive channels 16 and any thermal conductive channels 18.

At step 112, areas 41 are placed (i.e. punched) within the TIM pads 40 and TIM block 45 corresponding with solder bumps 17 on chips 13. This will allow these solder bumps on chip 13 to extend through the TIM pads 40 and TIM block 45 in order to mechanically and electrically connect another chip 13. At step 113, the chips 13 in the chip stack 10 are assembled with the TIM pads 40 and TIM block 45 in between two adjacent chips 13.

At step 114, the chip stack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with the TIM pad 40A (FIG. 1) in between.

At step 115, it is determined if the circuitry on chips 13 in chip stack 10 are to be tested. If it is determined in step 115 that testing the circuitry in the chip stack 10 is not to be performed, then the method 100 skips to step 119. However, if it is determined at step 115 that the circuitry on chips 13 in chip stack 10 are to be tested, then the circuitry is tested for electrical performance, at step 116.

At step 119, the method 100 attaches a heat sink 11 to one or more surfaces of one or more chips 13.

Figure 6B:
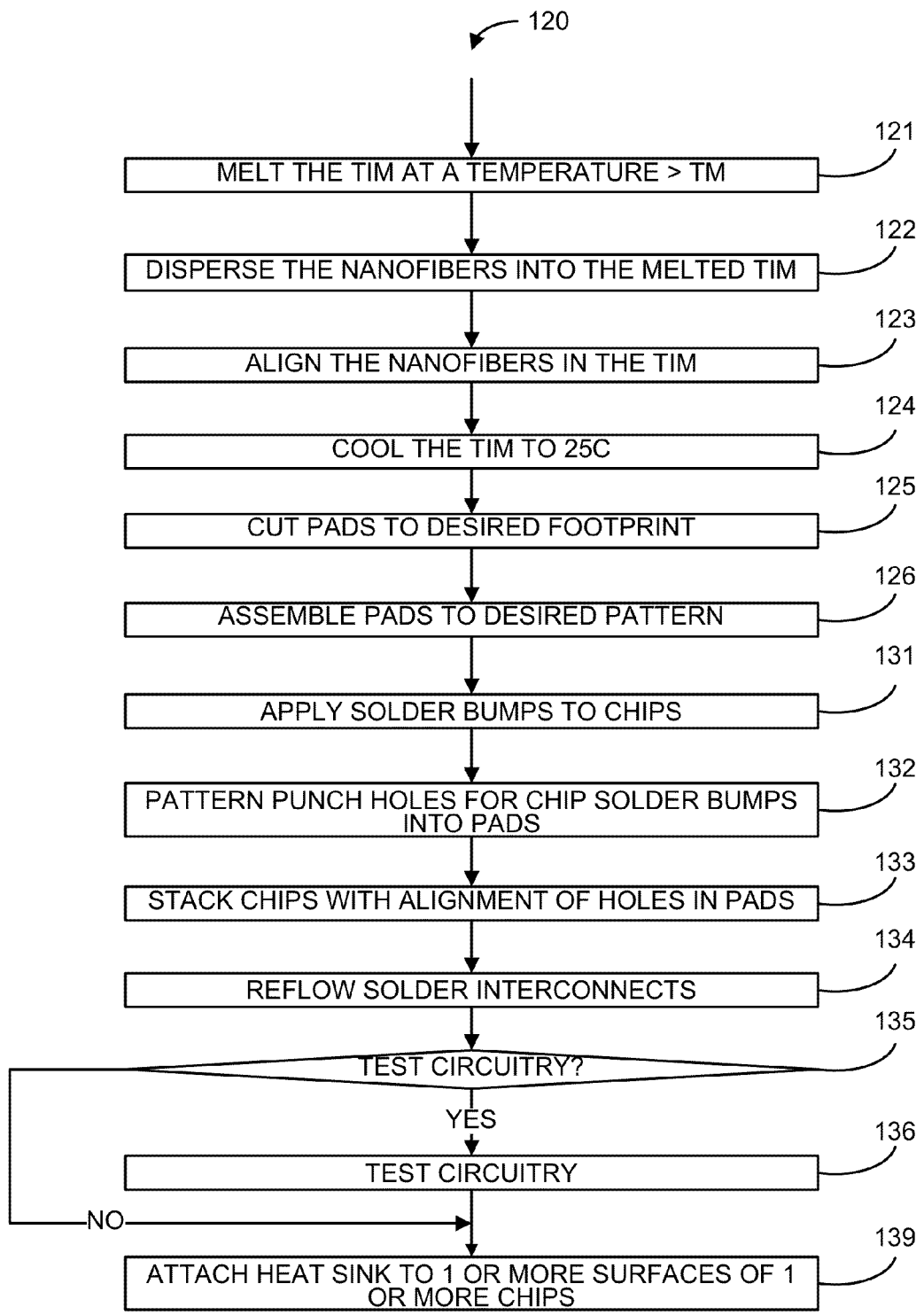
FIG. 6B is a flow chart illustrating an example of an alternative method of forming a silicone device utilizing the thermal interface material with graphite nanofibers horizontally/vertically aligned by a magnetic field and heat to orient the conductive axis in the desired direction of the present invention.

FIG. 6B is a flow chart illustrating an example of an alternative method of forming a silicone device utilizing the TIM 30 with graphite nanofibers 31 horizontally/vertically aligned by a magnetic field and heat to orient the conductive axis in the desired direction of the present invention.

At step 121, the TIM 30 is melted in crucible 22. In one embodiment, the base TIM 30 is melted at a temperature 12-20 C above the TIM 30 melting temperature. In one embodiment, the TIM 30 is a paraffin based material. In other embodiments, the TIM 30 can be, but is not limited to, paraffins ($C_nH_{2n+2}$); fatty acids ($CH_3(CH2)_nCOOH$); metal salt hydrates ($M_nH_2O$); and eutectics (which tend to be solutions of salts in water). In still another embodiment, the TIM 30 is a silicone-based gel or paste that is used as TIM 30 that is eventually cured into pads.

At step 122, the graphite nanofibers 31 are disbursed into the melted TIM 30 using well-established methods. In one embodiment, a high-speed dispersive mixer can be utilized. The amount of graphite nanofibers 31 in the TIM 30 of the present invention will typically be in the range of 4 to 12 weight percent based on the amount of TIM 30, preferably ~5 weight percent. The graphite nanofibers 31 typically are dispersed essentially homogeneously throughout the bulk of the TIM 30. In an alternative embodiment, carbon nanofibers or nanotubes may be substituted for the graphite nanofibers 31.

At step 123, a magnetic field 25 (FIG. 2B) of sufficient intensity is applied to the TIM 30 containing the graphite nanofibers 31, in order to align the graphite nanofibers 31. In one embodiment, the long axis of the graphite nanofibers 31 is aligned along the conductive axis of the graphite fibers. In another embodiment, the graphite nanofibers 31 are aligned in an orientation perpendicular to the mating surfaces. In still another embodiment, the magnetic field is normally within the range of 500-160,000 Gauss or 0.05-16 Tesla.

At step 124, the TIM 30 is cooled to approximately room temperature, i.e. approximately 20° C.-25° C. Once the TIM 30 with the aligned graphite nanofibers 31 has cooled to approximately room temperature, the TIM 30 is cut to the desired footprint for TIM pads 40 and blocks 45, at step 125. TIM pads 40 of appropriately sized geometry (length X, width Y and thickness Z) are cut from the slab of TIM 30 using conventional techniques known to those skilled in the art. The geometry of TIM pad 40 is dictated by the footprint of the integrated circuit to which the TIM pads 40 will be mated. At step 126, the TIM pads 40 and TIM block 45 are assembled into the desired pattern. In one embodiment, the pattern is the approximately square TIM pad 50. In another embodiment, the pattern is a rectangular TIM pad 60. In still another embodiment, the pattern is any geometry configuration designed for chip stacks 13.

At step 131, solder bumps 17 are then formed on the bottom surface of the chip 13. These solder bumps 17 are generally in alignment with the conductive channels 16 on chip 13 in order to conduct electrical signals. In an alternative embodiment, thermal conductive channels 18 may conduct heat instead of electrical signals and use a solder bump 17 with thermal conductive ability. In one embodiment, a homogenous process could be used to create solder bump 17 for both electrically conductive channels 16 and any thermal conductive channels 18.

At step 132, areas 41 are placed (i.e. punched) within the TIM pads 40 and TIM block 45 corresponding with solder bumps 17 on chips 13. This will allow these solder bumps on chip 13 to extend through the TIM pads 40 and TIM block 45 in order to mechanically and electrically connect another chip 13. At step 133, the chips 13 in the chip stack 11 are assembled with the TIM pads 40 and TIM block 45 in between two adjacent chips 13.

At step 134, the chip stack 11 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with the TIM pad 40A (FIG. 1) in between.

At step 135, it is determined if the circuitry on chips 13 in chip stack 11 is to be tested. If it is determined in step 135 that testing the circuitry in the chip stack 11 is not to be performed, then the method 110 skips to step 139. However, if it is determined at step 135 that the circuitry on chips 13 in chip stack 11 is to be tested, then the circuitry is tested for electrical performance, at step 136.

At step 139, the method 110 attaches a heat sink 13 to one or more surfaces of one or more chips 13.

Figure 7A:
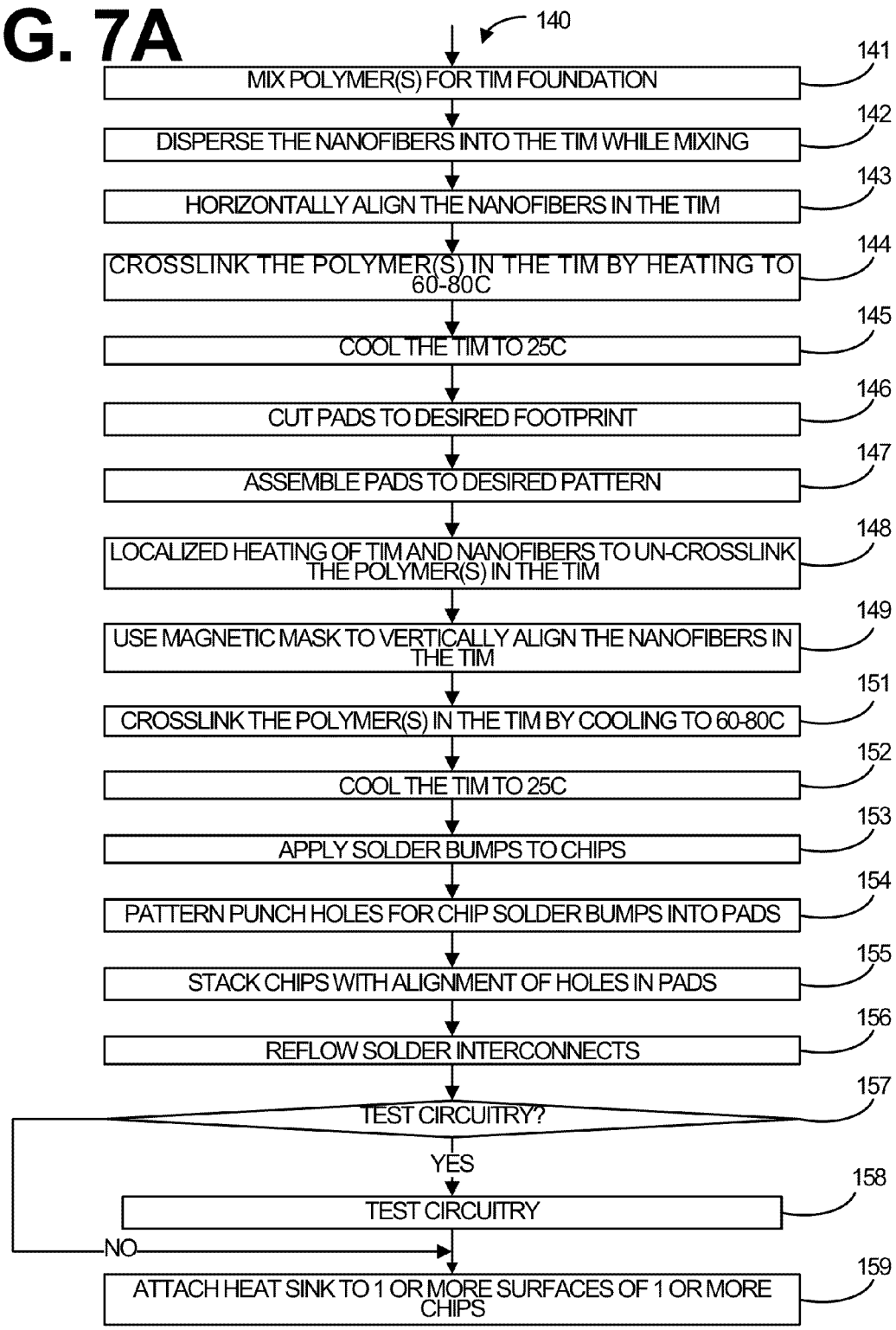
FIG. 7A is a flow chart illustrating an example of an alternative method of forming a silicone device utilizing the thermal interface material with graphite nanofibers horizontally/vertically aligned by a magnetic field to orient the conductive axis in the desired direction of the present invention.

FIG. 7A is a flow chart illustrating an example of an alternative method of forming a silicone device 13 utilizing the TIM 30 with graphite nanofibers 31, that is first horizontally aligned by a magnetic field 25 to orient the conductive axis in the desired directions, and then a centered portion vertically aligned by a magnetic field 25 to orient the conductive axis in the perpendicular or vertical direction.

At step 141, at least one thermosetting polymer is added to create the TIM 30 foundation. In one embodiment, the thermal interface material 30 is prepared according to the following procedure. To at least a 25 ml round bottom flask, aminopropylmethyl-dimethylsiloxane copolymer (5 g, 0.002 moles APTES) (commercially available from Gelest Inc.) is added along with 15 ml of anhydrous tetrahydrofuran (THF) and a stir bar. To this solution, furfuryl isocyanate (0.262 g, 0.002 moles) is added drop wise. The reaction is stirred for 24 hrs at 50 C. THF is removed via distillation to yield the desired furfuryl polydimethylsiloxane (PDMS).

In an alternative embodiment, polymer 2 was prepared according to the following procedure. To at least a 100 ml round bottom flask, a furan-protected maleic anhydride or furan-protected anhydride (0.5 g, 0.002 moles) is dissolved in 30 ml of benzene followed by the addition of a magnetic stir bar. To this solution, aminopropylmethyl-dimethylsiloxane copolymer (5 g, 0.002 moles APTES) (commercially available from Gelest Inc.) is added drop wise along with benzene (20 ml). This reaction is magnetically mixed for 2 hrs at 80 C. Then $ZnCl_2$ (0.27 g, 0.002 moles) is added and magnetically stirred for 30 min. Then a solution of hexamethyldisilazane (HMDS) (0.48 g, 0.003 moles) and benzene (2.0 ml) is added drop wise, brought to reflux, and mixed for 1 h. The solution is filtered and washed with 0.5 N HCl to work up the reaction product. The organic layer is dried with magnesium sulfate and the volatiles removed by distillation.

To prepare the TIM formulation, polymer 1 and polymer 2 are to be used at equal weight percents. While mixing polymer 1 and 2 together, the carbon fiber like structures can be added and mixed. Application of a suitable magnetic field allows for optimal alignment of the carbon nanofibers 31 like structures.

At step 142, the graphite nanofibers 31 are dispersed into the TIM 30 using well-established methods. In one embodiment, a high-speed dispersive mixer can be utilized. The amount of graphite nanofibers 31 in the TIM 30 of the present invention will typically be in the range of 4 to 14 weight percent based on the amount of TIM 30, preferably ~5 weight percent. The graphite nanofibers 31 typically are dispersed essentially homogeneously throughout the bulk of the TIM 30. In an alternative embodiment, carbon nanofibers or nanotubes may be substituted for the graphite nanofibers 31.

At step 143, a magnetic field 25 (FIG. 2B) of sufficient intensity is applied to the TIM 30 containing the graphite nanofibers 31, in order to horizontally align the graphite nanofibers 31. In one embodiment, the long axis of the graphite nanofibers 31 is aligned along the conductive axis of the graphite fibers. In another embodiment, the graphite nanofibers 31 are aligned in an orientation perpendicular to the mating surfaces. In still another embodiment, the magnetic field is normally within the range of 500-160,000 Gauss or 0.05-16 Tesla.

At step 144, the TIM 30 with the carbon nanofibers 31 is heated to a temperature to crosslink the polymers in the TIM 30. In the preferred environment, the temperature of the TIM 30 is heated to and maintained at approximately 60° C.-80° C. At step 145, the TIM 30 is cooled to approximately room temperature, i.e. approximately 20° C.-25° C.

Once the TIM 30 with the aligned graphite nanofibers 31 has cooled to approximately room temperature, the TIM 30 is cut to the desired footprint for TIM pads 40. TIM pads 40 of appropriately sized geometry (length X, width Y and thickness Z) are cut from the slab of TIM 30 using conventional techniques known to those skilled in the art. The geometry of TIM pad 40 is dictated by the footprint of the integrated circuit to which the TIM pads 40 will be mated. At step 147, the TIM pads 40 are assembled into the desired pattern. In one embodiment, the pattern is the approximately square TIM pad 50. In another embodiment, the pattern is a rectangular TIM pad 60. In still another embodiment, the pattern is any geometry configuration designed for chip stacks 13.

At step 148, the TIM pad 40 and graphite nanofibers 31 undergo localized heating to un-cross-link the polymers in the TIM pad 40. At step 149, a magnetic mask is used to vertically align graphite nanofibers 31 in the TIM pad 40. This creates the vertical heat transmission block 55 (FIG. 4) and vertical heat transmission block 65 (FIG. 5) that includes graphite nanofibers 32 that are perpendicular to all graphite nanofibers 31 in the TIM pad 40. At step 151, the TIM pad 40 is heated to a temperature to crosslink the polymers in the TIM pad 40. In the preferred embodiment, the temperature of the TIM pad 40 is cooled to and maintained at approximately 60° C.-80° C. in order to crosslink the TIM via a Diels-Alder reaction. At step 152, the TIM pad 40 is cooled to approximately room temperature. In one embodiment, room temperature is normally within the range of 60 to 80° F.

At step 153, solder bumps 17 are then formed on the bottom surface of the chip 13. These solder bumps 17 are generally in alignment with the conductive channels 16 on chip 13 in order to conduct electrical signals. In an alternative embodiment, thermal conductive channels 18 may conduct heat instead of electrical signals and use a solder bump 17 with thermal conductive ability. In one embodiment, a homogenous process could be used to create solder bump 17 for both electrically conductive channels 16 and any thermal conductive channels 18.

At step 154, areas 41 are placed (i.e. punched) within the TIM pad 40 corresponding with solder bumps 17 on chips 13. This will allow these solder bumps on chip 13 to extend through the TIM pad 40 in order to mechanically and electrically connect another chip 13. At step 155, the chips 13 in the chip stack 14 are assembled with the TIM pad 40 in between two adjacent chips 13.

At step 156, the chip stack 14 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with the TIM pad 40A (FIG. 1) in between.

At step 157, it is determined if the circuitry on chips 13 in chip stack 14 is to be tested. If it is determined in step 157 that testing the circuitry in the chip stack 14 is not to be performed, then the method 140 skips to step 159. However, if it is determined at step 157 that the circuitry on chips 13 in chip stack 14 is to be tested, then the circuitry is tested for electrical performance, at step 158.

At step 159, the method 140 attaches a heat sink 11 to one or more surfaces of one or more chips 13.

Figure 7B:
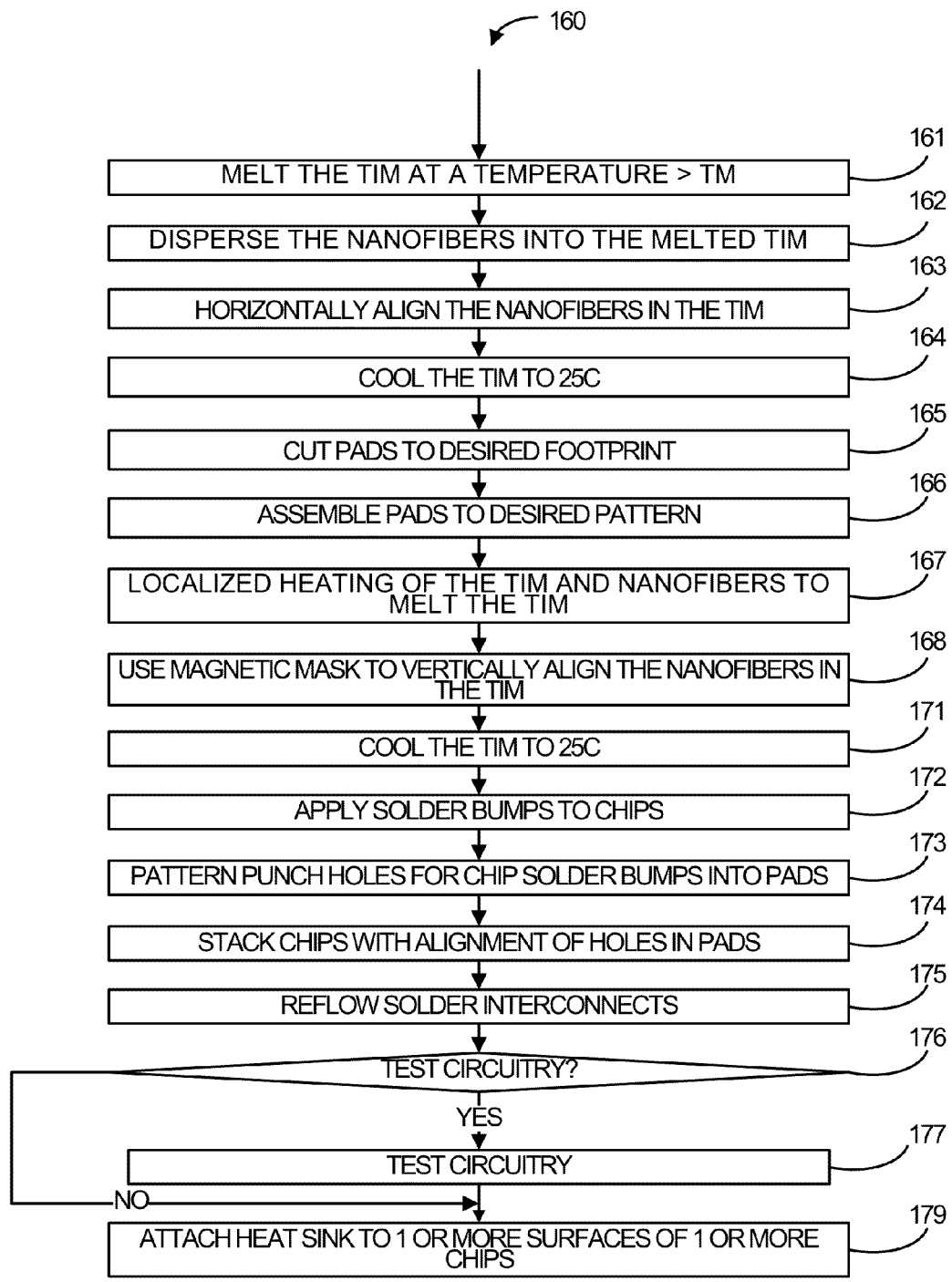
FIG. 7B is a flow chart illustrating an example of an alternative method of forming a silicone device utilizing the thermal interface material with graphite nanofibers horizontally/vertically aligned by a magnetic field to orient the conductive axis in the desired direction of the present invention.

FIG. 7B is a flow chart illustrating an example of an alternative method of forming a silicone device 13 utilizing the TIM 30 with graphite nanofibers 31, that is first horizontally aligned by a magnetic field 25 to orient the conductive axis in the desired directions, and then a centered portion vertically aligned by a magnetic field 25 to orient the conductive axis in the perpendicular or vertical direction.

At step 161, the TIM 30 is melted in crucible 22. In one embodiment, the base TIM 30 is melted at a temperature 16-20 C above the TIM 30 melting temperature. In one embodiment, the TIM 30 is a paraffin based material. In other embodiments, the TIM 30 can be, but is not limited to, paraffins ($C_nH_{2n+2}$); fatty acids ($CH_{17}(CH2)_nCOOH$); metal salt hydrates ($M_nH_2O$); and eutectics (which tend to be solutions of salts in water). In still another embodiment, the TIM 30 is a silicone-based gel or paste that are used as TIM 30 that are eventually cured into pads.

At step 162, the graphite nanofibers 31 are dispersed into the melted TIM 30 using well-established methods. In one embodiment, a high-speed dispersive mixer can be utilized. The amount of graphite nanofibers 31 in the TIM 30 of the present invention will typically be in the range of 4 to 16 weight percent based on the amount of TIM 30, preferably ~5 weight percent. The graphite nanofibers 31 typically are dispersed essentially homogeneously throughout the bulk of the TIM 30. In an alternative embodiment, carbon nanofibers or nanotubes may be substituted for the graphite nanofibers 31.

At step 163, a magnetic field 25 (FIG. 2B) of sufficient intensity is applied to the TIM 30 containing the graphite nanofibers 31, in order to align the graphite nanofibers 31. In one embodiment, the long axis of the graphite nanofibers 31 is horizontally aligned along the conductive axis of the graphite fibers. In another embodiment, the graphite nanofibers 31 are aligned in an orientation perpendicular to the mating surfaces. In still another embodiment, the magnetic field is normally within the range of 500-160,000 Gauss or 0.05-16 Tesla.

At step 164, the TIM 30 is cooled to approximately room temperature. In one embodiment, room temperature is normally within the range of 60 to 80° F. Once the TIM 30 with the aligned graphite nanofibers 31 has cooled to approximately room temperature, the TIM 30 is cut to the desired footprint for TIM pads 40, at step 165. TIM pads 40 of appropriately sized geometry (length X, width Y and thickness Z) are cut from the slab of TIM 30 using conventional techniques known to those skilled in the art. The geometry of TIM pad 40 is dictated by the footprint of the integrated circuit to which the TIM pads 40 will be mated. At step 166, the TIM pads 40 are assembled into desired pattern.

At step 167, the TIM pad 40 and graphite nanofibers 31 undergo localized heating of the TIM pad 40. At step 168, a magnetic mask is used to vertically align graphite nanofibers 31 in the TIM pad 40 and convert these graphite nanofibers 31 to graphite nanofibers 32. This creates the vertical heat transmission block 55 (FIG. 4) and vertical heat transmission block 65 (FIG. 5) that includes graphite nanofibers 32 that are perpendicular to all graphite nanofibers 31 in the TIM pad 40.

At step 171, the TIM pad 40 is cooled to approximately room temperature, i.e. approximately 20° C.-25° C.

At step 172, solder bumps 17 are then formed on the bottom surface of the chip 13. These solder bumps 17 are generally in alignment with the conductive channels 16 on chip 13 in order to conduct electrical signals. In an alternative embodiment, thermal conductive channels 18 may conduct heat instead of electrical signals and use a solder bump 17 with thermal conductive ability. In one embodiment, a homogenous process could be used to create solder bump 17 for both electrically conductive channels 16 and any thermal conductive channels 18.

At step 173, areas 41 are placed (i.e. punched) within the TIM pads 40 and TIM block 45 corresponding with solder bumps 17 on chips 13. This will allow these solder bumps on chip 13 to extend through the TIM pad 40 in order to mechanically and electrically connect another chip 13. At step 174, the chips 13 in the chip stack 11 are assembled with the TIM pad 40 in between two adjacent chips 13.

At step 175, the chip stack 11 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with the TIM pad 40A (FIG. 1) in between.

At step 176, it is determined if the circuitry on chips 13 in chip stack 11 is to be tested. If it is determined in step 176 that testing the circuitry in the chip stack 11 is not to be performed, then the method 160 skips to step 179. However, if it is determined at step 176 that the circuitry on chips 13 in chip stack 11 is to be tested, then the circuitry is tested for electrical performance, at step 177.

At step 179, the method 160 attaches a heat sink 11 to one or more surfaces of one or more chips 13.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A chip stack of semiconductor chips with enhanced cooling comprising:
   a first chip with circuitry on a first side;
   a second chip electrically and mechanically coupled to the first chip by a grid of connectors; and
   a thermal interface material pad placed between the first chip and the second chip, wherein the thermal interface material pad includes:
      a first plurality of magnetized nanofibers that are aligned parallel to mating surfaces of the first chip and the second chip and are aligned perpendicular to nearest first and second sides of the thermal interface material pad, wherein the first and second sides of the thermal interface material pad are opposing sides that extend perpendicular to the mating surfaces;
      a second plurality of magnetized nanofibers that are aligned parallel to the mating surfaces of the first chip and the second chip and are aligned perpendicular to nearest third and fourth sides of the thermal interface material pad, wherein the third and fourth sides of the thermal interface material pad are opposing sides that extend perpendicular to the mating surfaces and extend perpendicular to the first and second sides; and
      a third plurality of magnetized nanofibers that are aligned perpendicular to the mating surfaces of the first chip and the second chip.

2. The chip stack of claim 1, wherein the first plurality of magnetized nanofibers draw heat from the first chip and the second chip toward the first and second sides of the thermal interface material pad, the second plurality of magnetized nanofibers draw heat from the first chip and the second chip toward the third and fourth sides of the thermal interface material pad, and the third plurality of magnetized nanofibers is a vertical heat transmission channel between the mating surfaces of the first chip and the second chip.

3. The chip stack of claim 2, wherein the vertical heat transmission channel is formed by localized heating of an area in the thermal interface material pad to produce a heated area and using a magnetic mask to align nanofibers in the heated area to be perpendicular to the mating surfaces of the first chip and the second chip.

4. The chip stack of claim 2, wherein the vertical heat transmission channel is formed by cutting a block of thermal interface material into pieces with aligned nanofibers, and assembling the pieces of the thermal interface material into the thermal interface material pad.

5. The chip stack of claim 1, wherein the nanofibers are nanotubes.

6. The chip stack of claim 1, wherein the thermal interface material pad is divided into a first region comprising the first side, a second region comprising the second side, a third region comprising the third side, a fourth region comprising the fourth side, and a central region comprising a central portion of the thermal interface material pad adjacent to the first, second, third, and fourth regions.

7. A chip stack of semiconductor chips with enhanced cooling comprising:
   a first chip with circuitry on a first side;
   a second chip electrically and mechanically coupled to the first chip by a grid of connectors;
   a thermal interface material pad placed between the first chip and the second chip, wherein the thermal interface material pad includes:
      a first set of nanofibers aligned parallel to mating surfaces of the first chip and the second chip and aligned perpendicular to a second set of nanofibers, wherein the first set of nanofibers are aligned perpendicular to nearest first and second sides of the thermal interface material pad, the first and second sides of the thermal interface material pad are opposing sides that extend perpendicular to the mating surfaces, the second set of nanofibers are aligned parallel to the mating surfaces of the first chip and the second chip, the second set of nanofibers are aligned perpendicular to nearest third and fourth sides of the thermal interface material pad, and the third and fourth sides of the thermal interface material pad are opposing sides that extend perpendicular to the mating surfaces;
      a third set of nanofibers aligned perpendicular to the mating surfaces of the first chip and the second chip and aligned perpendicular to the first set of nanofibers and the second set of nanofibers;
   a first pair of heatsinks connected to the chip stack, wherein the first pair of heatsinks are connected to the thermal interface material pad on the conductive axis of the first set of nanofibers in the thermal interface material pad; and
   a second pair of heatsinks connected to the chip stack, wherein the second pair of heatsinks are connected to the thermal interface material pad on the conductive axis of the second set of nanofibers in the thermal interface material pad.

8. The chip stack of claim 7, wherein the nanofibers are nanotubes.

9. The chip stack of claim 6, wherein the first plurality of magnetized nanofibers comprises substantially all magnetized nanofibers within the first and second regions, and the second plurality of magnetized nanofibers comprises substantially all magnetized nanofibers within the second and third regions.

10. The chip stack of claim 9, wherein the central region comprises the third plurality of magnetized nanofibers.

11. The chip stack of claim 7, wherein the thermal interface material pad is divided into a first region comprising the first side, a second region comprising the second side, a third region comprising the third side, a fourth region comprising the fourth side, and a central region comprising a central portion of the thermal interface material pad adjacent to the first, second, third, and fourth regions.

12. The chip stack of claim 11, wherein the first set of nanofibers comprises substantially all nanofibers within the first and second regions, and the second set of nanofibers comprises substantially all nanofibers within the second and third regions.

13. The chip stack of claim 12, wherein the central region comprises the third set of nanofibers.

* * * * *